(12) United States Patent
Douskey et al.

(10) Patent No.: US 10,816,599 B2
(45) Date of Patent: Oct. 27, 2020

(54) DYNAMICALLY POWER NOISE ADAPTIVE AUTOMATIC TEST PATTERN GENERATION

(71) Applicant: International Business Machines Corporation, Armonk, NY (US)

(72) Inventors: Steven M. Douskey, Rochester, MN (US); Raghu G. Gopalakrishnasetty, Bangalore (IN); Sumit Panigrahi, Bangalore (IN); Mary P. Kusko, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 16/249,074

(22) Filed: Jan. 16, 2019

(65) Prior Publication Data

US 2020/0225283 A1    Jul. 16, 2020

(51) Int. Cl.
*G01R 31/3177* (2006.01)
*G01R 31/317* (2006.01)
*G01R 31/3183* (2006.01)
*G01R 31/3181* (2006.01)
*G01R 31/3185* (2006.01)

(52) U.S. Cl.
CPC ..... *G01R 31/3177* (2013.01); *G01R 31/3183* (2013.01); *G01R 31/31707* (2013.01); *G01R 31/31721* (2013.01); *G01R 31/31813* (2013.01); *G01R 31/318335* (2013.01); *G01R 31/318533* (2013.01); *G01R 31/318544* (2013.01); *G01R 31/318575* (2013.01)

(58) Field of Classification Search
CPC .......... G01R 31/3177; G01R 31/31721; G01R 31/31813; G01R 31/3183; G01R 31/318335; G01R 31/318575; G01R 31/318544; G01R 31/318533; G01R 31/31707
USPC .......... 714/738, 726, 727, 729, 731
See application file for complete search history.

(56) References Cited

U.S. PATENT DOCUMENTS

| | | | | |
|---|---|---|---|---|
| 4,097,773 | A | * | 6/1978 | Lindmark ............. H02M 7/537 323/271 |
| 6,028,373 | A | * | 2/2000 | Kim ........................ H02M 1/36 307/130 |
| 7,693,676 | B1 | * | 4/2010 | Keller ............ G01R 31/318575 702/118 |
| 7,757,137 | B2 | * | 7/2010 | Ortiz .............. G01R 31/318541 714/15 |
| 7,865,792 | B2 | | 1/2011 | Lin et al. |

(Continued)

OTHER PUBLICATIONS

Lin et al., Power Aware Embedded Test, 2011, IEEE, pp. 511-516 (Year: 2011).*

(Continued)

*Primary Examiner* — John J Tabone, Jr.
(74) *Attorney, Agent, or Firm* — Patterson + Sheridan, LLP

(57) ABSTRACT

Method and apparatus to test an integrated circuit includes retrieving power distribution data relating to an integrated circuit and designating a segment that includes at least one component of the integrated circuit. A switching limit associated with the segment may be set based on the power distribution data. Processes further generate a testing pattern that includes the determined switching limit associated with the segment.

20 Claims, 6 Drawing Sheets

(56) References Cited

U.S. PATENT DOCUMENTS

| | | | |
|---|---|---|---|
| 7,877,715 B1* | 1/2011 | Thirunavukarasu | ........................ G01R 31/318533 714/727 |
| 7,900,107 B2 | 3/2011 | Chen et al. | |
| 8,218,447 B2 | 7/2012 | Rajan et al. | |
| 8,392,868 B1* | 3/2013 | Thirunavukarasu | ........................ G01R 31/318533 714/732 |
| 8,397,113 B2 | 3/2013 | Bartenstein et al. | |
| 8,521,464 B2 | 8/2013 | Kumar et al. | |
| 8,549,372 B2 | 10/2013 | Wohl et al. | |
| 8,954,918 B2 | 2/2015 | Kapur et al. | |
| 9,170,301 B1* | 10/2015 | Gallagher | ........ G01R 31/31813 |
| 9,482,719 B2 | 11/2016 | Syed | |
| 9,588,177 B1* | 3/2017 | Atwood | ............. G01R 31/3187 |
| 9,817,068 B1 | 11/2017 | Chickermane et al. | |
| 2003/0229423 A1* | 12/2003 | Andarawis | ........ H02J 13/00009 700/286 |
| 2005/0152123 A1* | 7/2005 | Voreis | .................... H05B 45/10 362/3 |
| 2008/0052586 A1* | 2/2008 | Rajski | ............. G01R 31/31921 714/741 |
| 2009/0276644 A1* | 11/2009 | Goodnow | ................. G06F 1/26 713/310 |
| 2015/0187440 A1* | 7/2015 | Hollis | .................... G11C 29/36 714/719 |
| 2017/0154132 A1 | 6/2017 | Gizdarski | |
| 2018/0025787 A1 | 1/2018 | Kohli | |
| 2018/0045780 A1 | 2/2018 | Lin et al. | |
| 2018/0074122 A1* | 3/2018 | Payne | ............. G01R 31/31703 |

OTHER PUBLICATIONS

Zhang et al., Low-Power Weighted Random Pattern Testing, Nov. 2000, IEEE, vol. 19, No. 11, pp. 1389-1398. (Year: 2000).*

Butler et al.; "Minimizing Power Consumption in Scan Testing: Pattern Generation and DFT Techniques", ITC IEEE International Conference On, Oct. 26-28, 2004, pp. 355-364.

Patel, Miteshwar; "Automatic Test Pattern Generation With Power Aware . . . Used in Network Application", IJAREEIE Journal, vol. 2, Issue 6, Jun. 2013, pp. 2344-2354.

Huang et al.; "Scan Chain Diagnosis by Adaptive Signal Profiling With Manufacturing ATPG Patterns", ATS'09 IEEE Asian Test Symposium On, Nov. 23-26, 2009, pp. 35-40.

Yilmaz, Mahmut et al.; "A Brief Turtorial of test pattern Generation Using Fastscan v.0.2", Duke University, Jan. 11, 2008, pp. 1-55.

* cited by examiner

DYNAMICALLY POWER NOISE ADAPTIVE AUTOMATIC TEST PATTERN GENERATION

BACKGROUND

The present invention relates to computing systems, and more specifically, to electronic design automation (EDA) and other tools to design electronic systems, such as integrated circuits and printed circuit boards.

An automatic test pattern generator (ATPG) can be used to find a test sequence that distinguishes between correct and incorrect circuit behavior. Generated patterns can be used to test semiconductor devices after manufacture or to assist with determining a cause of failure. Despite their utility, conventional ATPGs have limitations in the faults that can be activated and propogated. For example, an ATPG cannot detect a fault during testing that relates to power dissipation across an integrated circuit, or microchip. Power dissipation is dynamic and uneven across a microchip. Active clock switching in the test sequence is adjacent and thus affected by localized high dynamic power dissipation. High switching limits associated with areas of high power dissipation can lead to false outputs.

SUMMARY

According to one particular embodiment, a method of testing an integrated circuit includes retrieving power distribution data relating to an integrated circuit; designating a segment comprising at least one component of the integrated circuit; setting a switching limit associated with the segment based on the power distribution data; and generating a testing pattern that includes the determined switching limit associated with the segment.

According to another particular embodiment, an apparatus includes a memory storing power distribution data relating to an integrated circuit; and a processor configured to retrieve the power distribution data; designate a segment comprising at least one component of the integrated circuit; set a switching limit associated with the segment based on the power distribution data; and generate a testing pattern that includes the determined switching limit associated with the segment.

According to another particular embodiment, program product to facilitate integrated circuit testing includes a computer readable storage medium having computer readable program code embodied therewith, the computer readable program code executable by a processor to access the memory and to execute the program code to retrieve the power distribution data; designate a segment comprising at least one component of the integrated circuit; set a switching limit associated with the segment based on the power distribution data; and generate a testing pattern that includes the determined switching limit associated with the segment.

DETAILED DESCRIPTION

Figure 1:
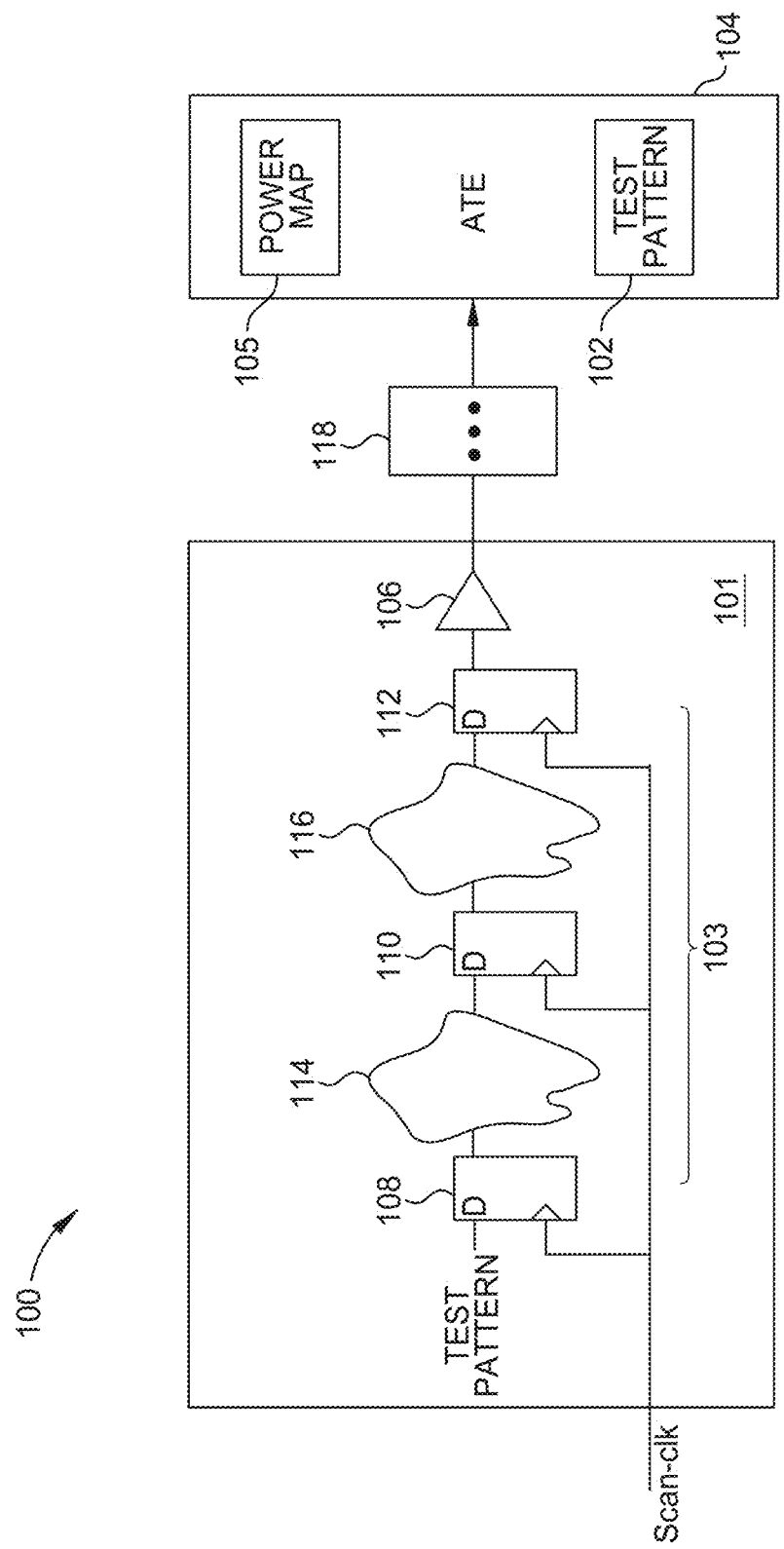
FIG. 1 shows an embodiment of an illustrative ATPG testing system 100 for testing an integrated circuit 102 in accordance with an embodiment.

An embodiment may retrieve a functional mode power distribution map file of a microchip design for which an ATPG is being run. The ATPG may read a power distribution across the design using the power distribution map. The ATPG may use the power distribution map to adjust and achieve lower switching limits for areas that have higher power dissipation. Additionally, the ATPG may achieve higher switching limits for design areas, or segments, having lower power dissipation. These features may address dynamic distribution of power across the microchip design to generate a relatively high number of useful ATPG patterns.

A method identifies differing power needs in various areas of a microchip and uses this data to effectively create ATPG patterns. The resulting patterns may have reduced scan switching power and may capture power in design areas of higher power dissipation. The method may maintain coverage in the lower power areas with normal scan and capture switching, while also meeting the global microchip power requirements. The power settings may be adapted for various target environments.

A particular embodiment of a system may use a power distribution map file during ATPG or logic built-in self-test (LBIST). Another embodiment alternatively or additionally uses variable capture/scan switching power limits during ATPG to meet local and global needs for various targeted environments. The system may generate patterns with different switching limits for each latch/flop and clock gate based on a statistical data of a power noise power profile. The power noises profile may be static or dynamic.

According to one particular implementation, the system may generate patterns with different switching limits for each latch or clock gate. Another embodiment of the system may generate patterns with the same or similar switching limits for each latch or clock gate.

A segment may include an LBIST channel or a channel group covered by a same weighting control. Each LBIST channel or group may be individually weighted to reduce its switching to an acceptable level determined by a worst case needs. At the same time, other lower power areas may continue with unweighted or less-weighted testing so that total microchip power needs are still met for a targeted environment.

Each segment may be identified as a separable scan partition. A multiple scan section (MSS) load of ATPG data may create data with different switching for each partition, while the total microchip power needs are still considered and met for the targeted environment.

Each segment may be identified as a group of related latches that are used by an ATPG to generate patterns with the correct switching in a given scannable or other physical area. Each grouping does not have to be a separate scan partition, but high and low switching areas may be mixed in the same scan paths. Scanning high switching patterns through low switching areas in in some cases may include hardware that overrides functional outputs during scanning. The patterns may meet the total microchip power parameters for the targeted environment.

Unlike implementations that are merely focused on timing or detecting crosstalk faults, hierarchical partitions, reducing care bits, an optimal scan architecture, or using test pattern switching activity, an embodiment of the system improves chip testing by focusing on microchip power. For instance, the system may use the global microchip power map to adjust an ATPG for the local power needs of sections of the microchip. Switching activity for one or more partitions may be adjusted based on the microchip power map.

An embodiment may reduce switching based on the power map not only at the global (e.g., entire) microchip level, but also at the local section level. That is, the system may make local adjustments for local power hot or cold spots (e.g., based on local power needs of sections of the microchip). That is, an embodiment of the system may tailor the switching to the needs at the local level. An embodiment may include a system that provides either power distribution file during pattern generation or variable switching limit during ATPG or LBIST.

Turning to the Drawings, FIG. 1 shows an embodiment of an illustrative ATPG testing system 100 for testing an integrated circuit 101 in accordance with an embodiment. Testing of digital systems, such as the core logic of the integrated circuit 101, may be performed by loading test patterns 102 into scan chains 103 into the system 100. Logic values of combination logic between flip flops of the scan chain 103 may be captured. The captured information may be shifted out and compared by Automatic Testing Equipment (ATE) 104.

More particularly, the ATPG system 100 may comprise a software design tool that simulates the overall functionality of the design or individual circuits within the design of the integrated circuit 101. The system 100 may generate the test patterns 102 for testing the stuck at "0" or "1" overall circuit node of a design. The test patterns 102 may be generated using sections based at least in part on a power distribution map 105. The ATE 104 may transmit the ATPG test patterns 102, or vectors, to the integrated circuit 101 or other under test device (UTD).

The ATE 104 may observe the output of the integrated circuit 101 to verify it may provide a particular degree of fault coverage or fault simulation for the circuitry in the product. Specifically, automatic test pattern generation techniques may provide test patterns for stuck-at faults, transition faults and path delay faults. The ATE 104 may be used in a manufacturing environment to test the die at wafer-level and in packaged tests. During testing of a die, test signals may be provided through input or input/output (I/O) buffers on the semiconductor die of the integrated circuit 101, and the test results may be monitored on output or I/O buffers.

As shown in FIG. 1, the integrated circuit 101 to be tested includes an output buffer 106 and at least one scan chain 103. The scan chain 103 at least has a plurality of flip-flops 108, 110 and a plurality of combinational logics 114, 116. During a test, the ATE 104 may send out the ATPG test patterns 102 to the integrated circuit 100. The ATPG test patterns 102 may be sequentially input into the combinational logics 114, 116 via the flip-flops 108, 110, triggered by a scan clock scan-clk. After the combinational logics 114, 116 receive the ATPG test patterns 102, the logics may output a logic value to a back-stage flip-flop 112. The logic values may be sequentially output from the output buffer 106 to the ATE 104 via a load board 118. The ATE 104 may compare the received ATPG test patterns 102 with the ATPG test patterns originally sent out to the integrated circuit 100. Based on the comparison result, the ATE 104 may determine whether the integrated circuit 100 should pass or be failed.

Structural logic test methodologies may be based on a full scan infrastructure. That is, all storage elements (e.g., flip-flops or latches) may be connected together into several scan chains 103 so that in test mode, data can be serially scanned into and out of these storage elements. Applying the test pattern 102 may include scanning in the power map 105 and pattern data, applying one or more functional clock cycles, and then scanning out the captured response data.

In an ATPG flow, deterministic test patterns may be pre-generated using a gate-level representation of the design netlist. These patterns may then be stored in tester memory and scanned into the circuit using a limited number of parallel scan chains.

Figure 2:
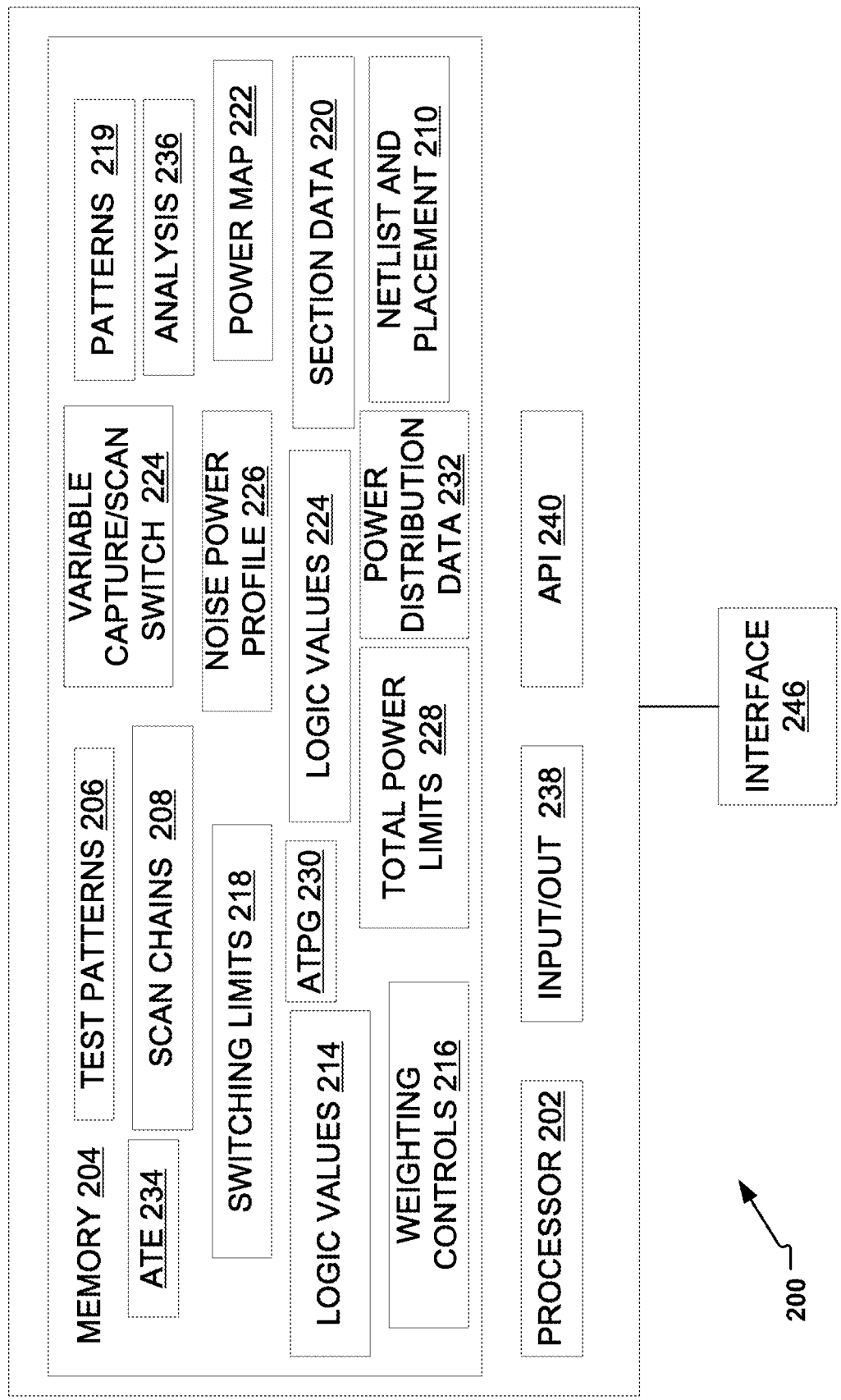
FIG. 2 is a block diagram of an embodiment of a system 200 configured to generate test patterns based on power data to test an integrated circuit in accordance with an embodiment.

FIG. 2 is a block diagram of an embodiment of a system 200 configured to generate test patterns based on power data to test an integrated circuit in accordance with an embodiment. While the system 200 may be internal to (e.g., onboard) a microchip with internal comparison circuits, the functionalities of the represented modules of the system 100 may be carried out on an external machine, such as by the ATE 104 of FIG. 1.

The illustrative system 200 includes a processor 202 and a memory 204. As represented in the block diagram, the memory 204 includes test pattern data 206 (e.g., ATPG test patterns), scan chain data 208, design netlist and component placement data 210, power distribution algorithms 212, logic values 214, weighting controls 216, switching limits 218, section data 220, and a power distribution map 222. The memory 204 also includes a variable capture/scan switching power limits 224 (e.g., during ATPG), as well as a power noise profile 226. Also included in the memory 204 may be total microchip power data 228, an ATPG 230, an ATE 234, and power distribution data 232.

The system 200 additionally includes an input/output (I/O) 238 module and an application program interface (API) 240, and an interface 246. The modules of the system 200 may retrieve power distribution data 232 for a microchip design for which the ATPG 230 is being run. The ATPG 230 may read a power distribution across the design using the power distribution map. The system 200 of an embodiment may use the power distribution map 222 to adjust and achieve lower switching limits for areas that have higher power dissipation. Additionally, the system 200 may achieve higher switching limits for design areas, or segments, having lower power dissipation. These features may address dynamic distribution of power across the microchip design to generate a relatively high number of useful ATPG patterns 206.

Figure 3:
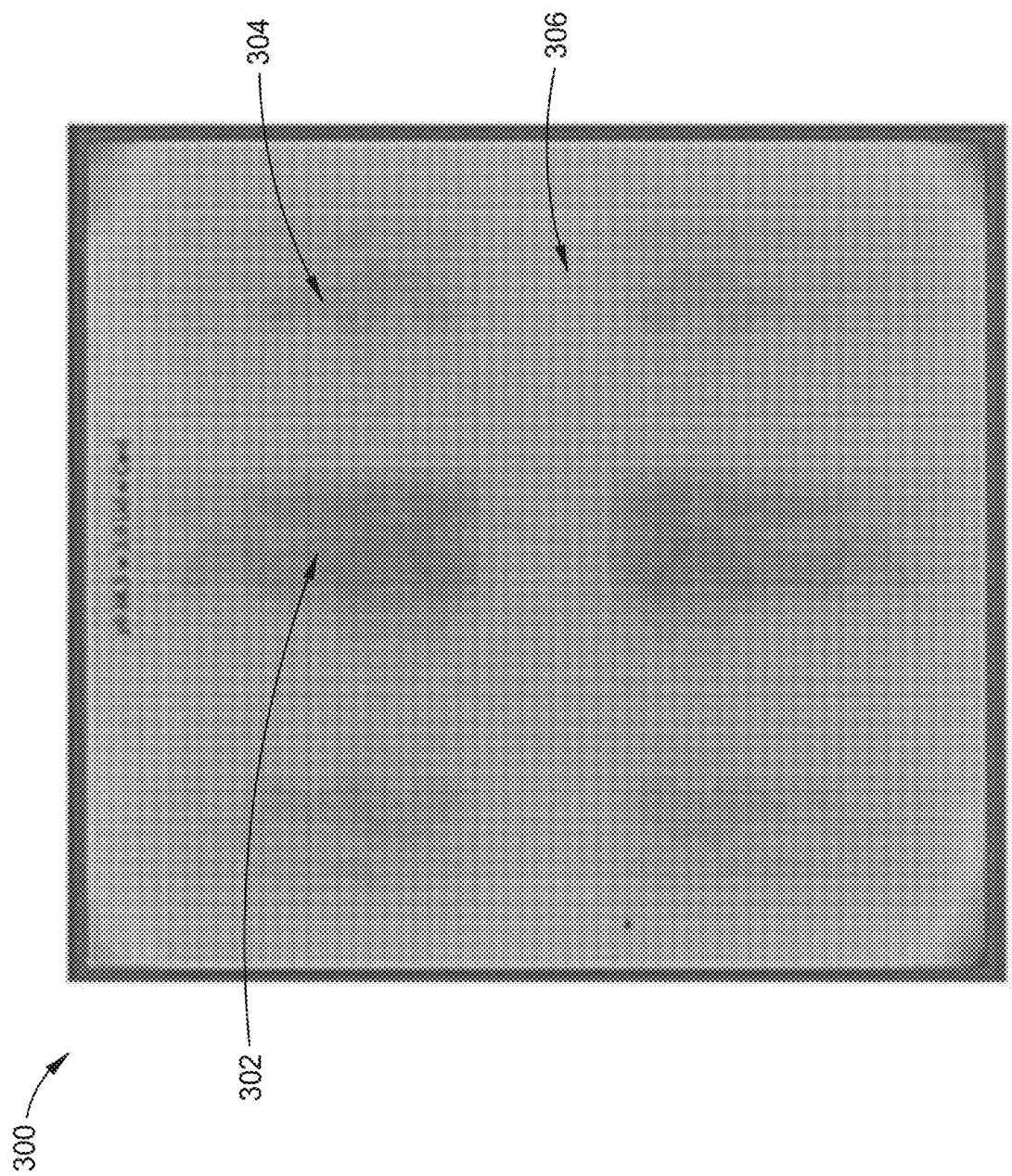
FIG. 3 illustrates a power distribution map 300 as may be generated and used by the systems 100, 200 of FIGS. 1 and 2, respectively, to affect switching in specific sections of a design for use in an ATPG test pattern.

FIG. 3 illustrates a power distribution map 300 as may be generated and used by the systems 100, 200 of FIGS. 1 and 2, respectively, to affect switching in specific sections of a design for use in an ATPG test pattern. The power distribution map 300 includes at least one region of high heat dissipation, as well as areas 304, 306, of medium and low heat dissipation, respectively.

The power dissipation map 300 may comprise a two-dimensional spatial distribution of heat dissipation in an integrated circuit. The power distribution map 300 for a given integrated circuit microchip may be estimated using voltages and currents in each device or in circuit blocks or other segments.

An embodiment of a power distribution map 300 may be discretized into time steps. In thermal analysis, the impulse response of a system corresponds to a heat-spread function, namely its thermal mask. The impulse of an embodiment may be determined using a Green's function or other linear differential equations. The thermal mask represents the amount of temperature rise that occurs in a solid due to a unit point heat source, and may be used to generate the power dissipation map.

Figure 4:
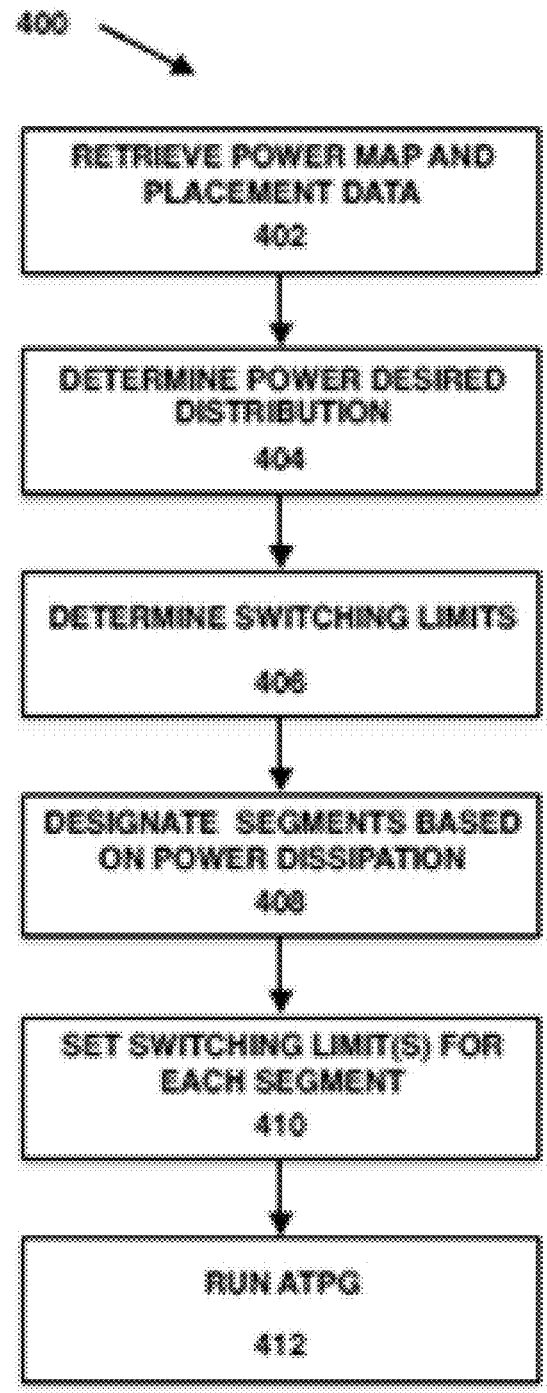
FIG. 4 is a flowchart of an embodiment of a method 400 of adjusting switching limits for segments of a microchip that have higher power dissipation.

FIG. 4 is a flowchart of an embodiment of a method 400 of adjusting switching limits for segments of a microchip that have higher power dissipation. The switching limits may be adjusted based on power distribution data, such as on a power distribution map. The method 400 may be performed by the respective systems 100, 200 of FIGS. 1 and 2, for example.

At 402, the system may retrieve a power distribution map, such as the power distribution map 300 of FIG. 3. The system at 402 may additionally retrieve other files, such as a design netlist or placement data relating to a position and configuration of latches, clock gates, and other microchip components.

The system at 404 may use mathematical algorithms to determine a preferred power distribution. Illustrative algorithms may incorporate statistical, static, and dynamic elements for a targeted environment. The system may determine a maximum value, an average power distribution value, and a mean value, among others. Examples of a targeted environment may include a wafer, a module burn-in, a system or other substrates.

The system may determine at least one of a maximum and a minimum switching limit at 406. According to one embodiment, switching limits may be determined based in part on at least one of the preferred power distribution and on a manufacturer recommendation regarding a microchip component. At 408, the system may divide the design into different segments on a basis of the determined power dissipation.

For each segment at 410, the system may set a switching limit based on the determined power dissipation of the individual segment. In one example, component(s) of a segment corresponding to a relatively hotter part of a design may have their switching limit lowered so that less switching occurs, and heat dissipation is reduced.

In another or the same embodiment, a switching limit may be set for a group of multiple segments. As described herein, an embodiment of a segment may include an LBIST channel or a channel group covered by a same weighting control. Each LBIST channel or group may be individually weighted to reduce its switching to an acceptable level determined by a worst case needs. At the same time, other lower power areas may continue with unweighted or less-weighted testing so that total microchip power needs are still met for a targeted environment.

Each segment may be identified as a separable scan partition, such that a multiple scan section (MSS) load of ATPG data can create data with different switching for each partition and the total microchip power needs are still considered and met for the targeted environment. Each segment may be identified as a group of related latches that may be used by an ATPG to generate patterns with the correct switching in a given scannable or other physical area. Each grouping does not have to be a separate scan partition, but high and low switching areas may be mixed in the same scan paths.

The system may run at 412 the ATPG to generate one or more ATPG patterns. The ATPG patterns may be used to test semiconductor devices after manufacture or to assist with determining a cause of failure.

In this manner, the method 400 identifies differing power needs in various areas of a microchip and uses this data to effectively create ATPG or LBIST patterns. The resulting patterns may have reduced scan switching power and may capture power in design areas of higher power dissipation. The method may maintain coverage in the lower power areas with normal scan and capture switching, while also meeting the global microchip power requirements. An embodiment of the method 400 may reduce switching based on the power map not only at the entire microchip level, but also at the local section level. That is, the system may make local adjustments for local power hot or cold spots based on local power needs of sections of the microchip.

Figure 5:
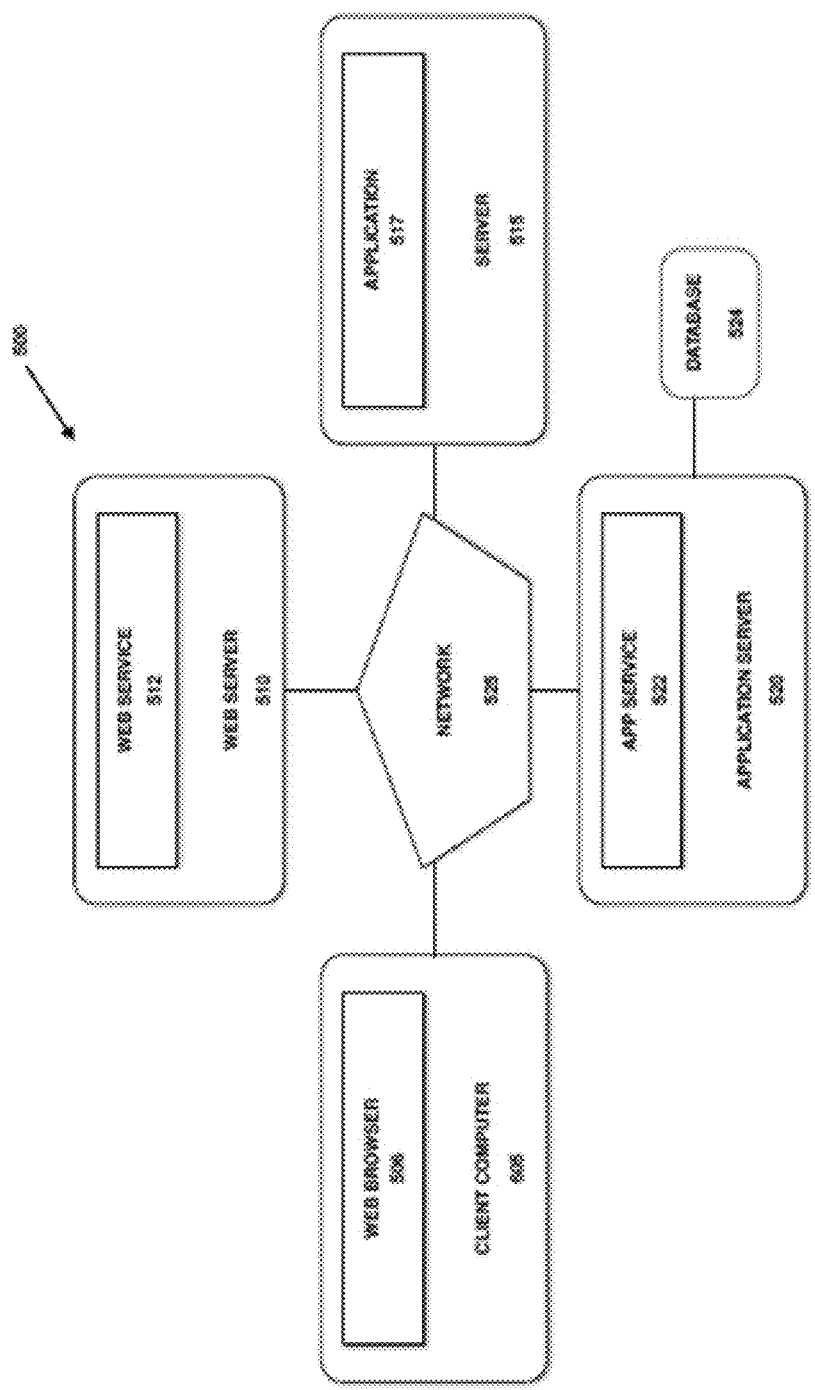
FIG. 5 illustrates another example computing system according to one embodiment, such as may be realized using a networked environment.

FIG. 5 illustrates another example computing system according to one embodiment, such as may be realized using a networked environment. As shown, the computing environment 500 includes a client computer 505, a web server 510, a server 515, and an application server 520. The client computer 605 may be a physical system (e.g., a desktop, laptop computer, mobile device, etc.) or a virtual computing instance executing in the cloud. The client computer 505 includes a web browser 506. A user may access data services through the web browser 507 over a network 525 (e.g., the Internet).

For instance, a user may access a web service 512 executing on a web server 510. In one embodiment, the web service 512 provides a web interface for an application server 520 (e.g., executing an application service 522). More specifically, the application service 522 provides a database 524. The database 524 may include data presented to users on the web browser 507.

Figure 6:
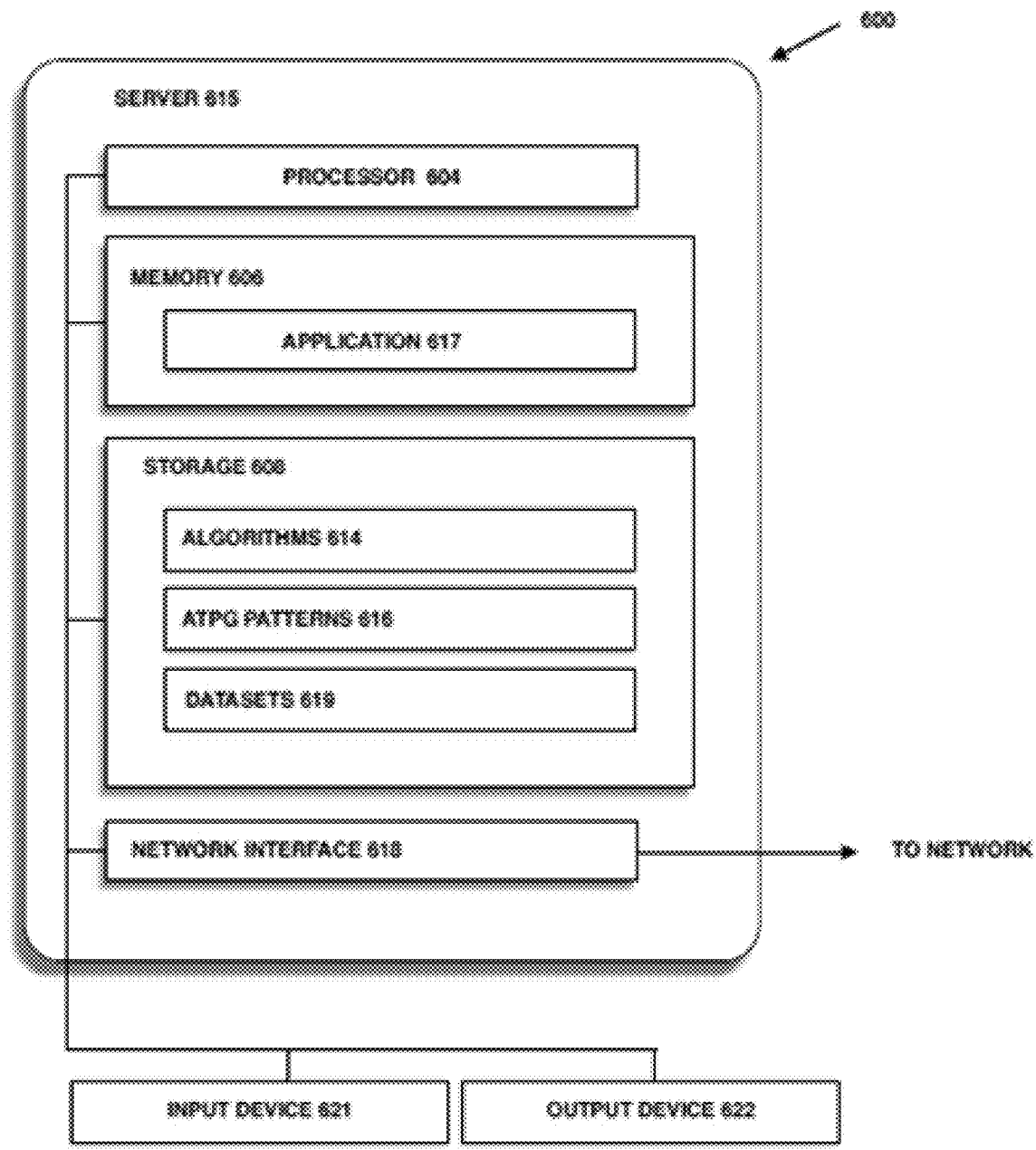
FIG. 6 further illustrates a server, such as the server of FIG. 5, according to one embodiment.

FIG. 6 further illustrates a server 615, such as the server 515 of FIG. 5, according to one embodiment. The server 615 generally includes a processor 604 connected via a bus to a memory 606, a network interface device 618, a storage 608, an input device 621, and an output device 624. The server 615 is generally under the control of an operating system. Examples of operating systems include the UNIX operating system, versions of the Microsoft Windows operating system, and distributions of the Linux operating system (UNIX is a registered trademark of The Open Group in the United States and other countries. Microsoft and Windows are trademarks of Microsoft Corporation in the United States, other countries, or both. Linux is a registered trademark of Linus Torvalds in the United States, other countries, or both). More generally, any operating system supporting the functions disclosed herein may be used. The processor 604 is included to be representative of a single CPU, multiple CPUs, a single CPU having multiple processing cores, and the like. Similarly, the memory 606 may be a random access memory. While the memory 606 is shown as a single identity, it should be understood that the memory 606 may comprise a plurality of modules, and that the memory 606 may exist at multiple levels, from high speed registers and caches to lower speed but larger DRAM chips. The network interface device 618 may be any type of network communications device allowing the navigation server 610 to communicate with other computers via the network 625.

The storage 608 may be a persistent storage device. Although the storage 608 is shown as a single unit, the storage 608 may be a combination of fixed and/or removable storage devices, such as fixed disc drives, solid state drives, removable memory cards, optical storage and network storage systems.

As shown, the memory 606 contains the application 617, which may be an application generally executed to take actions described herein. Storage 608 contains the algorithms 614, ATPG test patterns 616, and datasets 619.

The input device 621 may provide a keyboard and/or a mouse, etc. The output device 622 may be any conventional display screen. Although shown separately from the input device 621, the output device 624 and input device 621 may be combined. For example, a display screen with an integrated touch-screen may be used.

The descriptions of the various embodiments of the present invention have been presented for purposes of illustration, but are not intended to be exhaustive or limited to the embodiments disclosed. Many modifications and variations may be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It may be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It may also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access applications (e.g., threshold adjustment algorithms) or related data available in the cloud. For example, the modules of FIG. 1 could execute on a computing system in the cloud. In such a case, the threshold adjustment algorithms could adjust response thresholds and store the new values at a storage location in the cloud. Doing so allows a user to access this information from any computing system attached to a network connected to the cloud (e.g., the Internet).

While the foregoing is directed to embodiments of the present invention, other and further embodiments of the invention may be devised without departing from the basic scope thereof. While certain embodiments are applicable to spoken language systems, the claims are not limited or even particularly applicable to spoken language interfaces. In one example, an embodiment of a method may not relate to speech modality. The scope thereof is thus determined by the claims that follow.

What is claimed is:

1. A method of testing an integrated circuit, the method comprising:
   retrieving power distribution data relating to an integrated circuit;
   designating a segment comprising at least one component of the integrated circuit;
   setting a switching limit associated with the segment based on the power distribution data; and
   generating a testing pattern that includes the determined switching limit associated with the segment.

2. The method of claim 1, further comprising determining a total microchip power parameter associated with the integrated circuit.

3. The method of claim 2, further comprising operating within a limit of the total microchip power parameter.

4. The method of claim 1, further comprising determining a desired power distribution.

5. The method of claim 1, wherein the power distribution data comprises a power distribution map.

6. The method of claim 1, wherein the power distribution data comprises at least one of variable capture and scan switching power limits determined during testing.

7. The method of claim 1, wherein the power distribution data comprises power noise power profile.

8. The method of claim 1, further comprising determining a switching limit.

9. The method of claim 1, wherein setting the switching limit further includes reducing an amount of switching in the segment, wherein the segment has a high power dissipation or temperature in relation to a second segment.

10. The method of claim 1, wherein setting the switching limit further includes adjusting an amount of switching in the segment, while leaving a second amount of switching in a second segment unchanged.

11. The method of claim 1, further comprising using component placement data to set the switching limit.

12. An apparatus comprising:
   a memory storing power distribution data relating to an integrated circuit; and
   a processor configured to:
      retrieve the power distribution data;
      designate a segment comprising at least one component of the integrated circuit;
      set a switching limit associated with the segment based on the power distribution data; and
      generate a testing pattern that includes the determined switching limit associated with the segment.

13. The apparatus of claim 12, wherein the processor is onboard the integrated circuit.

14. The apparatus of claim 12, wherein the processor is remote from the integrated circuit.

15. The apparatus of claim 12, wherein the processor is further configured to determine a total microchip power parameter associated with the integrated circuit.

16. The apparatus of claim 12, wherein the processor is further configured to determine a desired power distribution.

17. The apparatus of claim 12, wherein the power distribution data comprises a power distribution map.

18. The apparatus of claim 12, wherein the processor is further configured to determine a switching limit.

19. The apparatus of claim 12, wherein the processor is configured to set the switching limit by reducing an amount of switching in the segment, wherein the segment has a high power dissipation or temperature in relation to a second segment.

20. A program product to facilitate integrated circuit testing, the program product comprising a computer readable storage medium having computer readable program code embodied therewith, the computer readable program code executable by a processor to access the memory and to execute the program code to:

retrieve power distribution data;

designate a segment comprising at least one component of the integrated circuit;

set a switching limit associated with the segment based on the power distribution data; and generate a testing pattern that includes the determined switching limit associated with the segment.

\* \* \* \* \*